United States Patent
Sasaki et al.

(10) Patent No.: US 9,960,388 B2
(45) Date of Patent: May 1, 2018

(54) DISPLAY DEVICE WITH LIGHT EMITTING ELEMENTS AND PIXEL ELECTRODES

(71) Applicant: Japan Display Inc., Minato-ku (JP)

(72) Inventors: Tohru Sasaki, Minato-ku (JP); Toshihiro Sato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days. days.

(21) Appl. No.: 15/295,153

(22) Filed: Oct. 17, 2016

(65) Prior Publication Data
US 2017/0125739 A1 May 4, 2017

(30) Foreign Application Priority Data
Oct. 28, 2015 (JP) .................. 2015-211697

(51) Int. Cl.
*H01L 51/52* (2006.01)
*H01L 27/32* (2006.01)

(52) U.S. Cl.
CPC .......... *H01L 51/5271* (2013.01); *H01L 27/32* (2013.01); *H01L 27/3246* (2013.01); *H01L 51/5218* (2013.01); *H01L 51/5284* (2013.01)

(58) Field of Classification Search
CPC . H01L 51/52; H01L 51/5271; H01L 51/5218; H01L 51/5284; H01L 27/3246
See application file for complete search history.

(56) References Cited

U.S. PATENT DOCUMENTS

| | | | |
|---|---|---|---|
| 2006/0132684 A1* | 6/2006 | Tanaka | G02F 1/134309 349/114 |
| 2015/0270319 A1* | 9/2015 | Ishii | H01L 27/3246 257/40 |
| 2016/0172628 A1* | 6/2016 | Hashimoto | H01L 51/5265 257/40 |
| 2016/0216548 A1* | 7/2016 | Fujikawa | G02F 1/1345 |
| 2016/0322440 A1* | 11/2016 | Murata | G02B 27/017 |

FOREIGN PATENT DOCUMENTS

JP 10-255986 9/1998

\* cited by examiner

*Primary Examiner* — Phuc Dang
(74) *Attorney, Agent, or Firm* — Oblon, McClelland, Maier & Neustadt, L.L.P.

(57) ABSTRACT

A display device includes: pixel electrodes that respectively correspond to unit pixels composing an image; an insulation layer that is arranged to be put on a peripheral part of each of the pixel electrodes and is light transmitting; a light emitting layer that is laminated in contact with a central part surrounded by the peripheral part in each of the pixel electrodes and is arranged to emit light with a luminosity controlled by a current; and a common electrode that is laminated in contact with the light emitting layer and is arranged to be put on the insulation layer over the pixel electrodes. Each of the pixel electrodes has a surface on which the insulation layer and the light emitting layer are put. The peripheral part is either light absorbing or light transmitting on the surface, and the central part is light reflecting on the surface.

3 Claims, 10 Drawing Sheets

DISPLAY DEVICE WITH LIGHT EMITTING ELEMENTS AND PIXEL ELECTRODES

CROSS-REFERENCE TO RELATED APPLICATION

The present application claims priority from Japanese application JP2015-211697 filed on Oct. 28, 2015, the content of which is hereby incorporated by reference into this application.

BACKGROUND OF THE INVENTION

1. Field of the Invention

The present invention relates to a display device having a light emitting element that is a spontaneous light emitting type display element such as an electro luminescence (EL) element and an organic EL element.

2. Description of the Related Art

On a light emitting display device including an organic EL display device, a light emitting layer is held between a common electrode and a pixel electrode that is light reflecting. Respective pixels of a light emitting display device are isolated by a bank layer composed of an insulation layer that is light transmitting, and a pixel electrode is separately disposed for each pixel, and a peripheral part of the pixel electrode is covered by the bank layer.

JPH10-255986A describes disposing a black material in contact with a translucent electrode on a light emitting display.

A part of light that a light emitting layer of the organic EL display device emits is incident onto the inside of the bank layer and may be reflected by a pixel electrode. When light emitted from the light emitting layer is reflected by the peripheral part of the pixel electrode that exists under the bank layer, it goes outside via a neighboring pixel, and a light leakage and light mixing occur, which might cause a deterioration of a display quality.

SUMMARY OF THE INVENTION

It is an object of the present invention to provide a display device that suppresses an occurrence of the light leakage and the light mixing from neighboring pixels, in view of the above problem.

In view of the above problem, a display device according to the present invention includes: a plurality of pixel electrodes that correspond to each of a plurality of unit pixels composing an image; an insulation layer that is arranged to be put on a peripheral part of each of the plurality of pixel electrodes and is light transmitting; a light emitting layer that is laminated in contact with a central part surrounded by the peripheral part in each of the plurality of pixel electrodes and is arranged to emit light with a luminosity controlled by a current; and a common electrode that is laminated in contact with the light emitting layer and is arranged to be put on the insulation layer over the plurality of pixel electrodes; wherein each of the plurality of pixel electrodes has a surface on which the insulation layer and the light emitting layer are put, the peripheral part is either light absorbing or light transmitting on the surface, and the central part is light reflecting on the surface.

In view of the above problem, a manufacturing method of a display device includes the steps of: arranging a plurality of pixel electrodes that correspond to each of a plurality of unit pixels composing an image; arranging an insulation layer that is light transmitting so as to be put on a peripheral part of each of the plurality of pixel electrodes; modifying a surface of the plurality of pixel electrodes in a central part surrounded by the peripheral part using the insulation layer as a mask; laminating a light emitting layer that emits light with a luminosity controlled by a current so as to be in contact with the central part of each of the plurality of pixel electrodes that have been modified; and arranging a common electrode so as to be in contact with the light emitting layer and be put on the insulation layer over the plurality of pixel electrodes, wherein in the step of arranging the plurality of pixel electrodes the plurality of pixel electrodes are formed so as to be either light absorbing or light transmitting, and in the step of modifying the surface the surface is modified to be light reflecting in the central part.

DETAILED DESCRIPTION OF THE INVENTION

Below, organic EL display devices according to respective embodiments of the present invention will be explained with reference to the accompanying drawings.

First Embodiment

Figure 1:
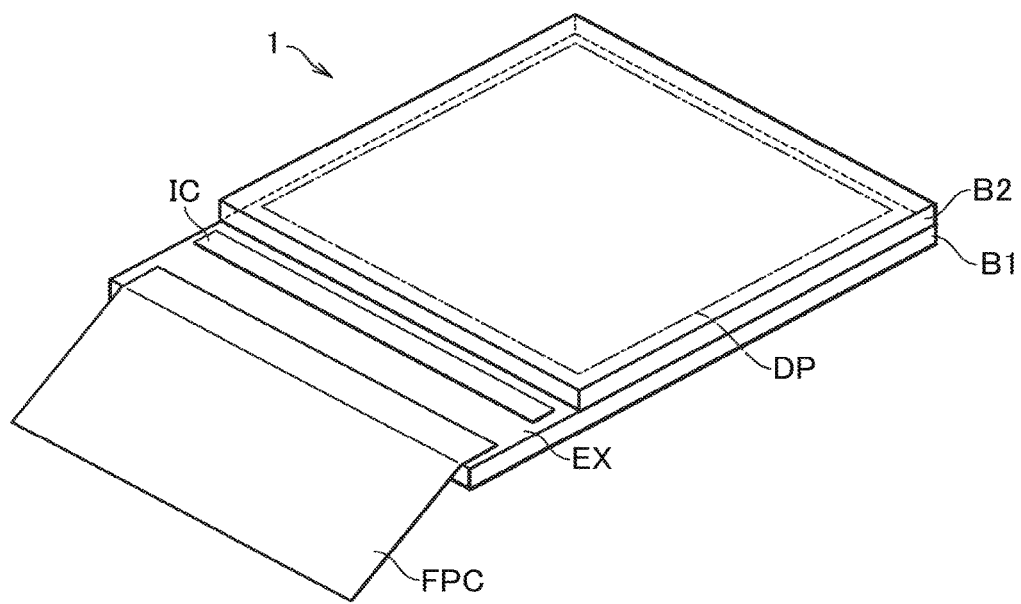
FIG. 1 illustrates a perspective view of a light emitting display device according to the first embodiment.

FIG. 1 illustrates a perspective view for describing an organic EL display device 1 as a light emitting display device according to the first embodiment. The organic EL display device 1 according to this embodiment is configured such that a second substrate B2 is laminated with a first substrate B1 on which organic electroluminescent elements as a plurality of light emitting elements are disposed, and on a region of the first substrate B1 that is not covered by the second substrate B2 (an exposure region EX), a driver semiconductor device IC for driving the organic EL display device 1 is disposed. Further, near an edge of the exposure region EX of the first substrate B1, a flexible printed substrate FPC is disposed.

Figure 2:
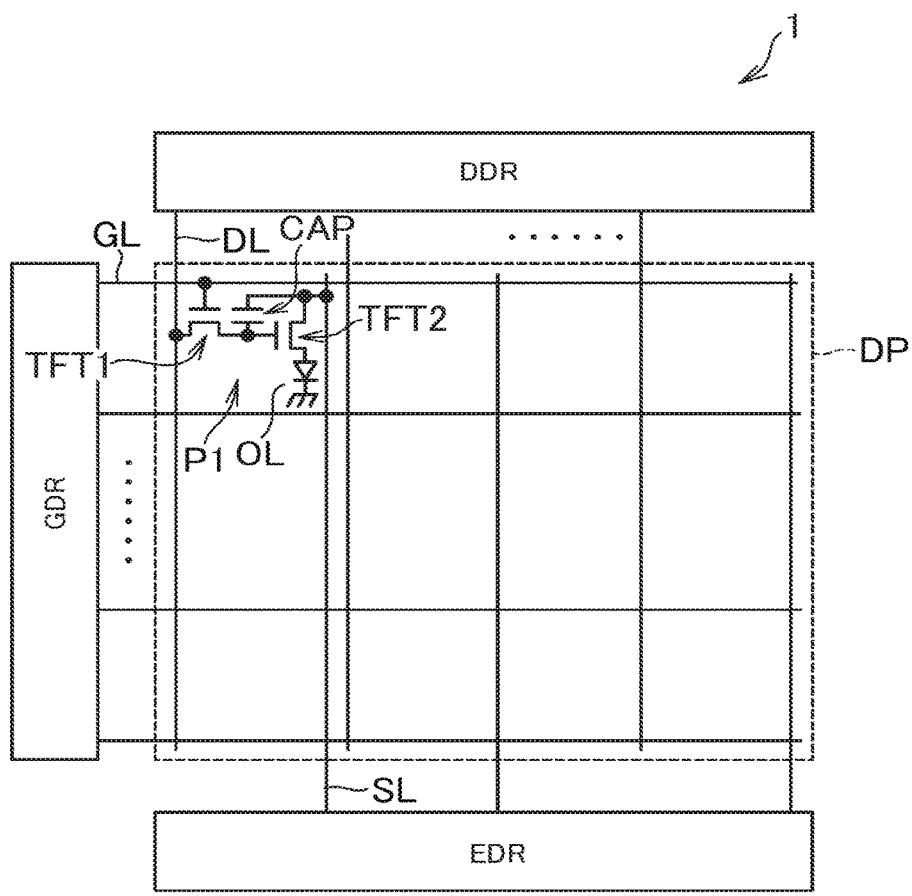
FIG. 2 schematically illustrates a pixel circuit of the light emitting display device according to the first embodiment.

FIG. 2 illustrates a configuration of a pixel circuit in a display region DP of the organic EL display device 1 according to the first embodiment. The organic EL display device 1 is provided with the display region DP that displays an image, a scan signal line driving part GDR, a video signal line driving part DDR and an electric power driving part EDR.

In the display region DP, an organic electroluminescence element OL and a pixel circuit P1 are disposed in a matrix arrangement in correspondence with each of a plurality of unit pixels composing an image, and the pixel circuit P1 is composed of a thin film transistor TFT1, a capacitor element CAP, and a thin film transistor TFT2. The scan signal line driving part GDR, a video signal line driving part DDR, and the electric power driving part EDR controls a light emission of the organic electroluminescence element OL by driving the pixel circuit P1.

The scan signal line driving part GDR is connected to a scan signal line GL provided for each of an array of pixels arranged in the horizontal direction (a pixel row), and outputs a scan signal to the scan signal line GL selected in order.

The video signal line driving part DDR is connected to a video signal line DL provided for each array of pixels arranged in the vertical direction (a pixel column), and outputs, in accordance with a selection of the scan signal line GL by the scan signal line driving part GDR, a voltage according to a video signal of the selected pixel row to each video signal line DL. The voltage is written into a capacitor inside the pixel circuit P1, and a current according to the voltage that has been written thereinto is supplied to the organic electroluminescence element OL.

The electric power driving part EDR is connected to a driving electric power line SL provided for each pixel column, and supplies a current to the organic electroluminescence element OL via a switching element inside the pixel circuit P1.

Figure 3:
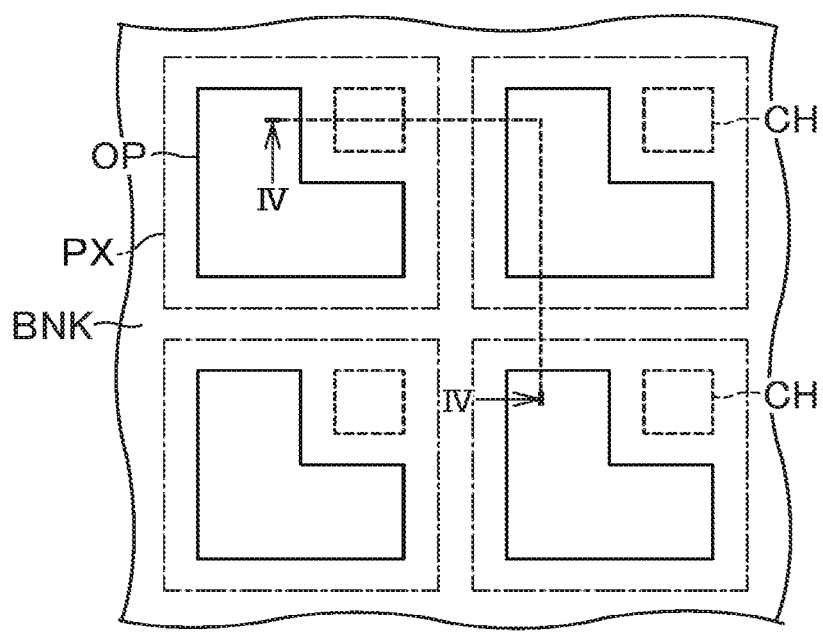
FIG. 3 schematically illustrates a planar view of the pixel of the light emitting display device according to the first embodiment.

FIG. 3 illustrates a planar structure of the pixel in the organic EL display device 1 according to the first embodiment. As illustrated in FIG. 3, the peripheral part of the pixel electrode PX is configured such that the bank layer BNK that is a light transmitting insulation layer is put thereon, a central part of the pixel electrode PX is exposed from the bank layer BNK through the opening OP. Further, a contact hole CH for inputting a current according to a signal from the video signal line DL to the pixel electrode PX in formed at a position overlapped with the bank layer BNK.

Figure 4:
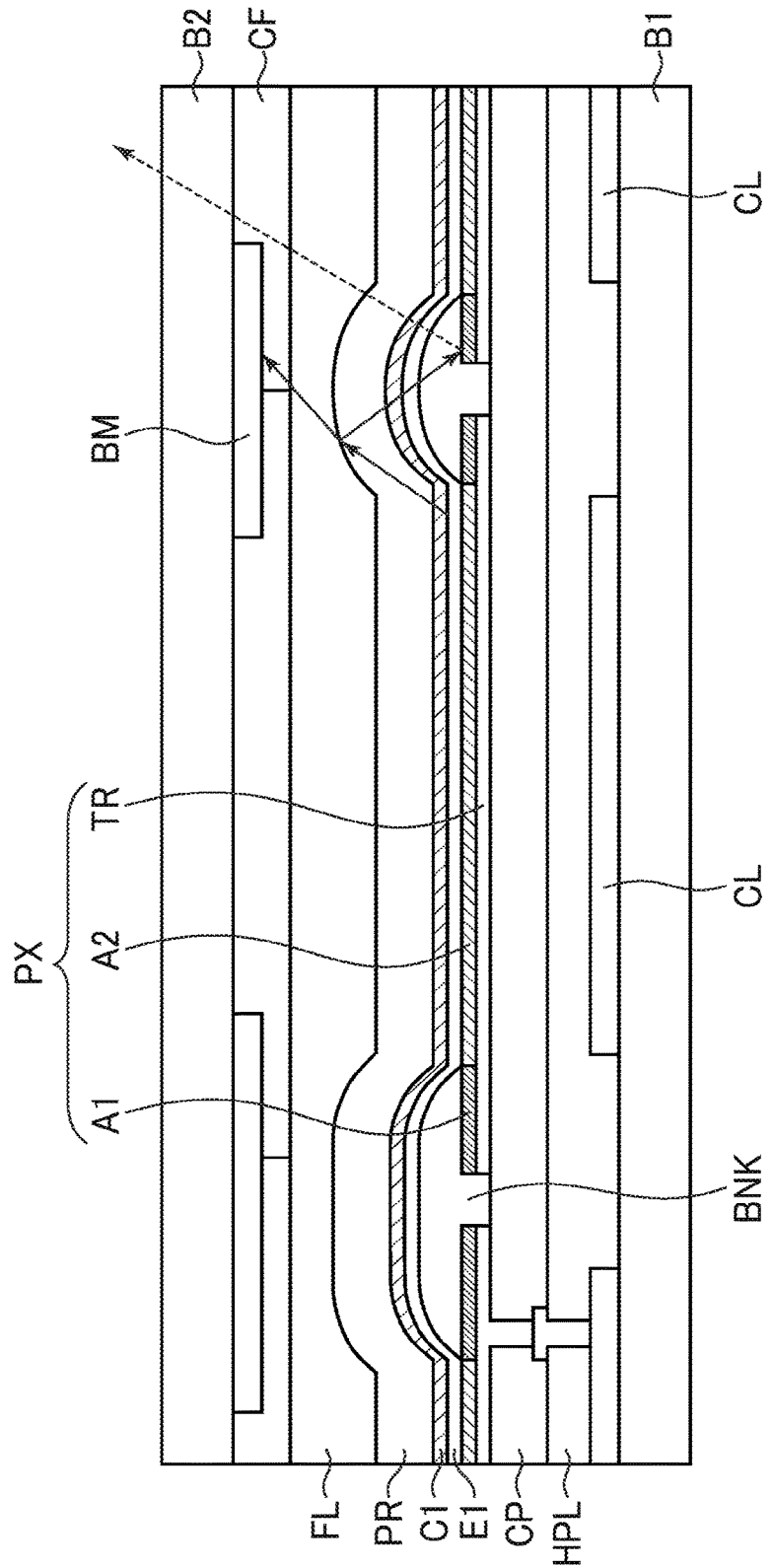
FIG. 4 schematically illustrates a configuration of IV-IV cross section of FIG. 3.

FIG. 4 illustrates a schematic structure of IV-IV cross section of FIG. 3. As illustrated in FIG. 3, the organic EL display device 1 is configured to include the first substrate B1 that has a plurality of pixel electrodes PX formed in accordance with each pixel, the second substrate B2 that is disposed opposed to the first substrate and on which a color filter layer CF and a black matrix BM are formed, and a fill layer FL that is filled between the first substrate B1 and the second substrate B2.

Here, a light emitting layer is E1 is held between a common electrode C1 that is formed so as to be commonly shared by the respective pixels and the pixel electrode PX, and these constitute the organic electroluminescence element OL in FIG. 2. The common electrode C1 is formed as a single layer that is commonly shared by a plurality of pixels, and the upper side thereof is protected by a seal layer PR. Further, under the pixel electrode PX and a capacitor insulation film CP, a conductive film (not shown) is disposed, and these constitute the capacitor element CAP in FIG. 2. Moreover, on the first substrate B1, a circuit constituting layer CL is disposed, and a planarizing film HPL to planarize the bump made by the circuit constituting layer CL is disposed. The circuit constituting layer CL includes elements such as the thin film transistor TFT2 in FIG. 2, and it is configured that a current according to the video signal from the video signal line DL is individually supplied to each pixel through a connection of the thin film transistor TFT2 to the pixel electrode PX via the contact hole.

The light emitting layer E1 according to this embodiment is laminated so as to be in contact with the central part surrounded by the peripheral part of the pixel electrode PX, and is configured to include a hole carrier layer, a light emitting part, and an electron carrier layer. In the light emitting part of the light emitting layer E1, a light emission is caused by a recombination of a hole injected from the pixel electrode PX and an electron injected from the common electrode C1, and the light is emitted with a luminosity controlled by the current. Further, as the light emitting layer E1, all the constituting layers may be formed across the whole range of the display region DP, and the light emitting layer E1 may be formed individually for each pixel.

Here, specifically, the pixel electrode PX has a surface on which the bank layer BNK and the light emitting layer E1 is put, the central part of the pixel electrode PX that has a surface on which the light emitting layer E1 is put is light reflecting, and the peripheral part of the pixel electrode PX that has a surface covered by the bank layer BNK is configured to be either light absorbing or light transmitting so that a light leakage to a neighboring pixel and light mixing will not occur.

The pixel electrode PX according to this embodiment is configured to include an absorbing electrode layer A1, reflecting electrode layer A2 and a transparent conductive layer TR, and the absorbing electrode layer A1 is overlapped with the bank layer BNK and is positioned at the peripheral part of the pixel electrode PX. The reflecting electrode layer A2 is formed in a self-alignment manner at a part that is not covered with the bank layer BNK, and is positioned at the central part of the pixel substrate PX. Further, the transparent conductive layer TR is formed with, for example, a transparent film such as Indium Tin Oxide (ITO), and is for electrically connecting the reflecting electrode layer A2 and the thin film transistor TFT2 in the circuit constituting layer CL.

The absorbing electrode layer A1 is composed of a compound that can be reduced to a metal and is light absorbing. Specifically, it is formed with of a metal oxide, a metal halide, and a metal sulfide that are light absorbing. Further, the reflecting electrode layer A2 of the central part of the pixel electrode PX is formed by reducing those metal oxide and the like to a metal. Specifically, the absorbing electrode layer A1 is composed of an oxide, an halide, and a sulfide of a metal such as Ag, Ti, Ta, Mn, Cr, Cu or Co, and the reflecting electrode layer A2 is formed by reducing the materials of the absorbing electrode layer A1 to a metal such as Ag with reducing fluid such as hydrogen and carbon monoxide.

As seen above, by disposing a light absorbing material in the peripheral region of the pixel electrode PX and disposing a reflecting electrode layer that reflects light emitted by the light emitting layer E1 toward the side of the color filter layer CF in the central part of the pixel electrode PX, the light that has propagated into the inside of the bank layer BNK is prevented from further propagating into neighboring pixels as illustrated by the arrows in FIG. 4.

Figure 5:
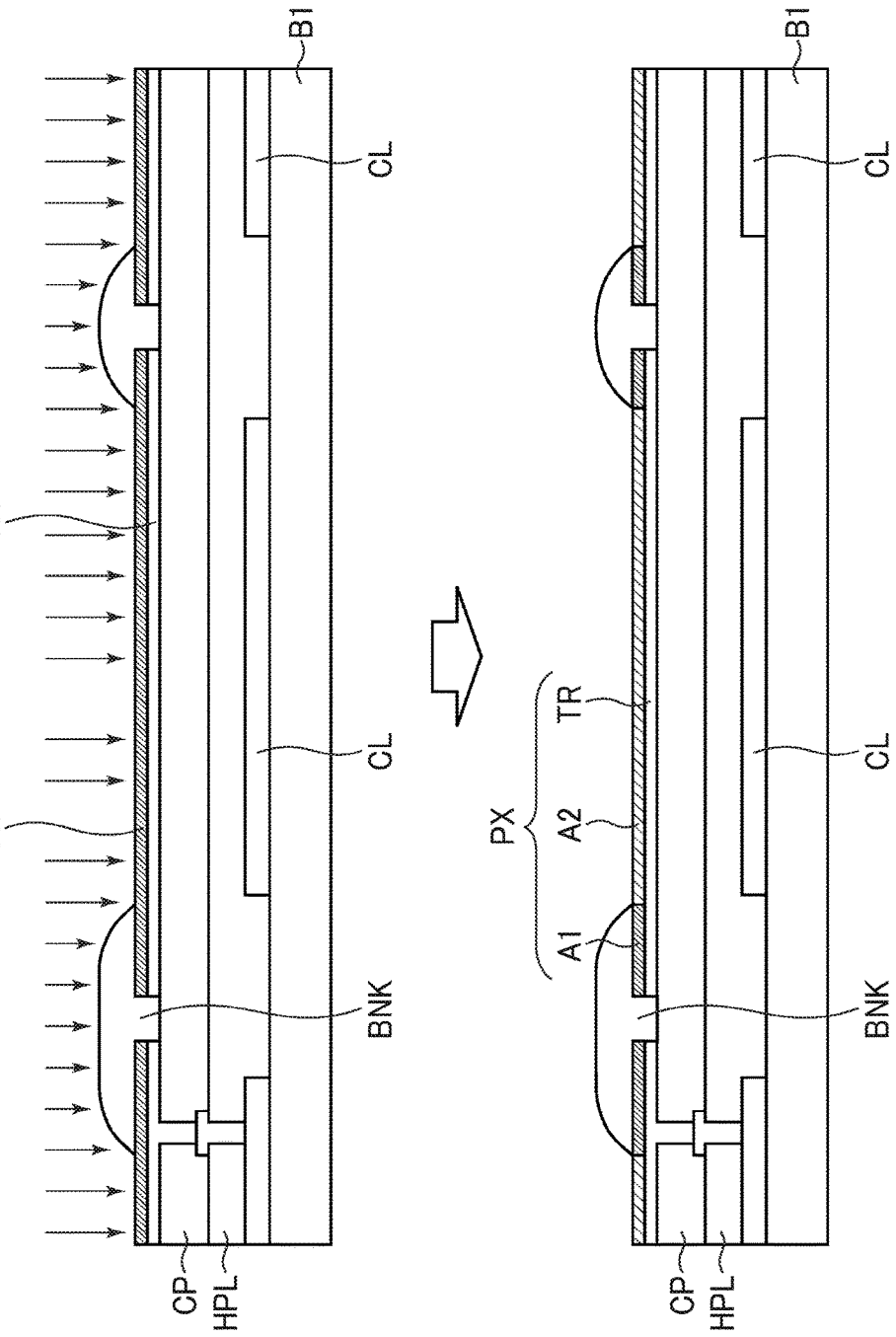
FIG. 5 illustrates a formation of the pixel electrode of the light emitting display device according to the first embodiment.

FIG. 5 illustrates a formation of the pixel electrode PX of the light emitting display device 1 according to this embodiment. In a manufacturing process of the light emitting display device 1 according to this embodiment, after firstly forming the pixel electrode PX in each pixel, the bank layer BNK that is disposed on the peripheral part of the pixel electrode PX is formed, and the surface of the central part of the pixel electrode PX that is exposed and is using the bank layer BNK as a mask is modified. Thereafter, the light emitting layer E1 is laminated so as to be in contact with the central part of the pixel electrode PX that has been modified, and the common electrode C1 is further formed so as to be put on the light emitting layer E1 and the bank layer BNK.

Here, in particular, as illustrated in FIG. 5, the pixel substrate PX according to this embodiment is formed so as to be light absorbing and the surface of the central part is modified so as to be light reflecting. Specifically, under the condition that a film made of the same material as the absorbing electrode layer A1 is laminated on the transparent conductive layer TR composing the pixel electrode, and the bank layer BNK is further laminated on the peripheral part of the pixel electrode PX, the first substrate B1 is exposed to an atmosphere of the reducing fluid and heated. A reducing reaction that oxygen, chlorine and the like are removed from a part of the absorbing electrode layer A1 that is not covered by the bank layer BNK occurs, and the reflecting electrode layer A2 made of a light reflecting metal is formed in a self-alignment manner.

Second Embodiment

Next, the light emitting display device 1 according to the second embodiment of the present invention is explained.

Figure 6:
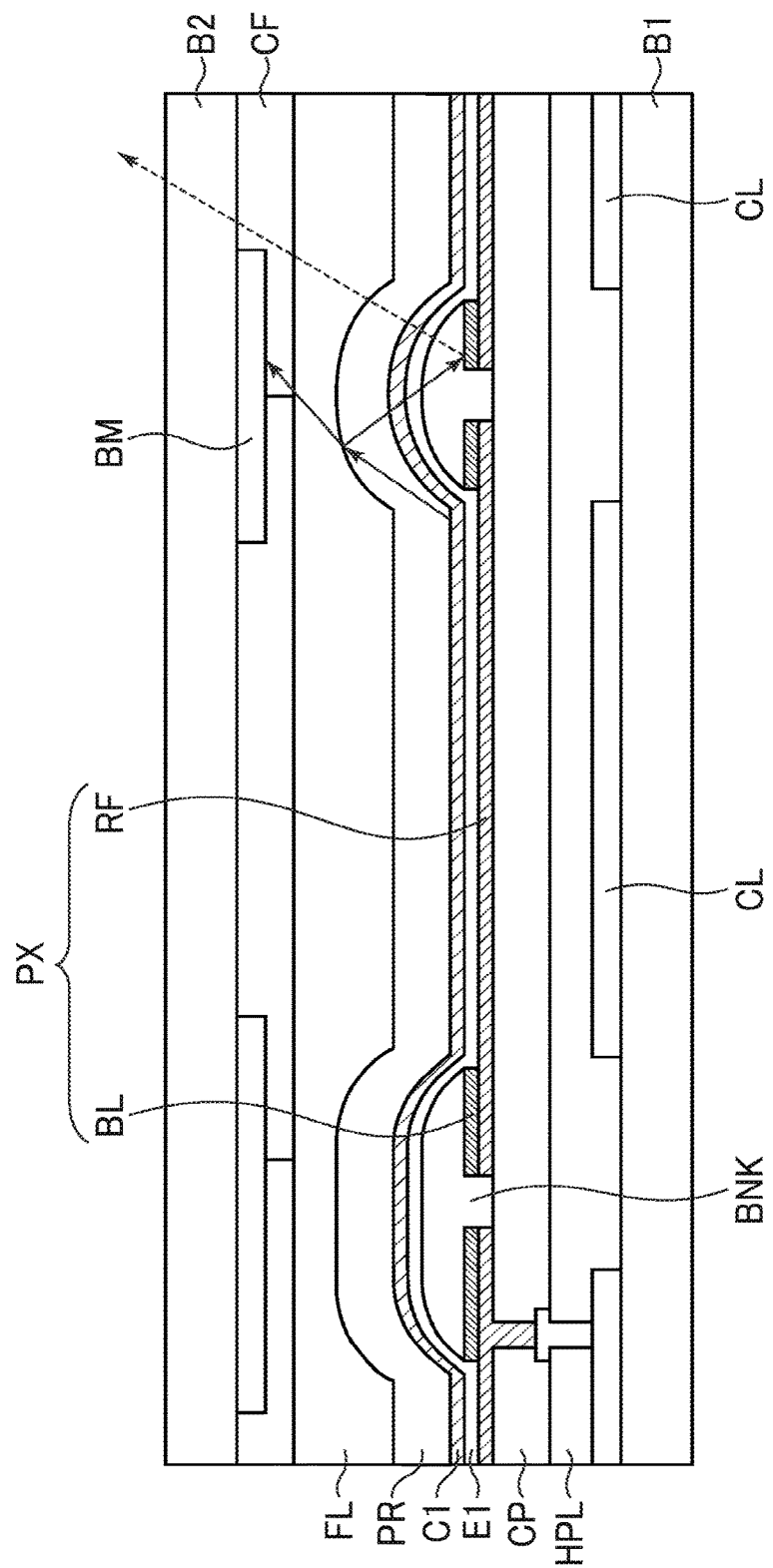
FIG. 6 schematically illustrates a cross section of the pixel of the light emitting display device according to the second embodiment.

FIG. 6 illustrates a sectional view of a schematic structure of the pixel of the light emitting display device 1 according to the second embodiment, and corresponds to IV-IV cross section of FIG. 3. As illustrated in FIG. 6, the pixel electrode PX of the light emitting display device 1 according to the second embodiment is configured to include a reflecting electrode RF and a light absorbing electrode layer BL. Specifically, the light absorbing electrode layer BL corresponds to the surface on which the bank layer BNK is put in the pixel electrode PX, and the reflecting electrode RF corresponds to the surface on which the light emitting layer E1 is put in the pixel electrode PX.

Figure 7:
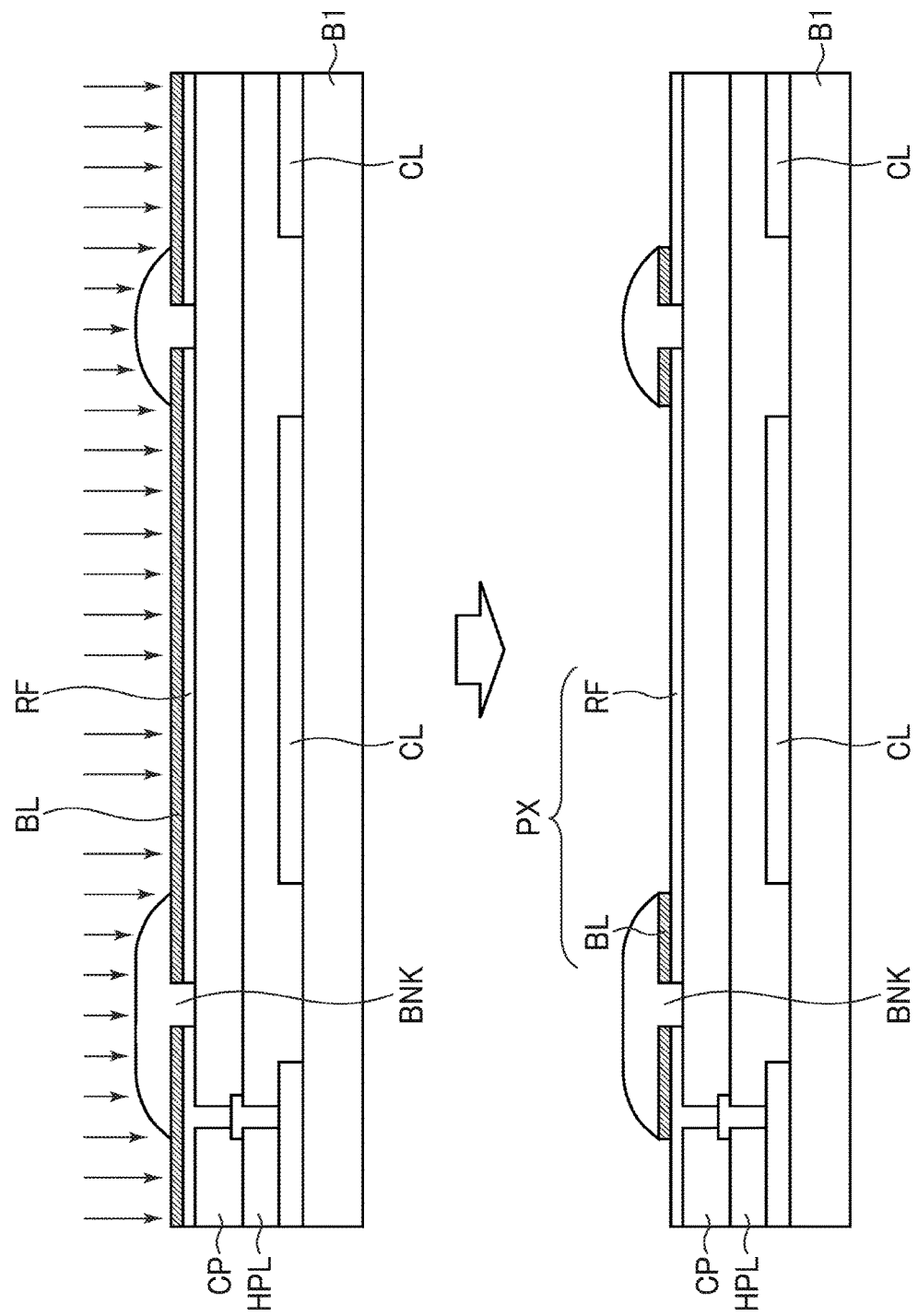
FIG. 7 illustrates a formation of the pixel electrode of the light emitting display device according to the second embodiment.

The reflecting electrode RF is composed of, for example, a metallic film that is mainly composed of aluminum, silver, or the like, and the light absorbing electrode layer BL is composed of a black film that is light absorbing such as chromium. As illustrated in FIG. 7, the pixel electrode PX according to the second embodiment is formed by firstly laminating the light absorbing electrode layer BL on the reflecting electrode RF, and then etching (removing) the light absorbing electrode layer BL at the central part of the pixel substrate PX with a use of the bank layer BNK laminated on the peripheral part of the pixel electrode PX as the mask to modify the central part. Note that the light absorbing electrode layer BL is not necessarily formed with a metal.

Figure 8:
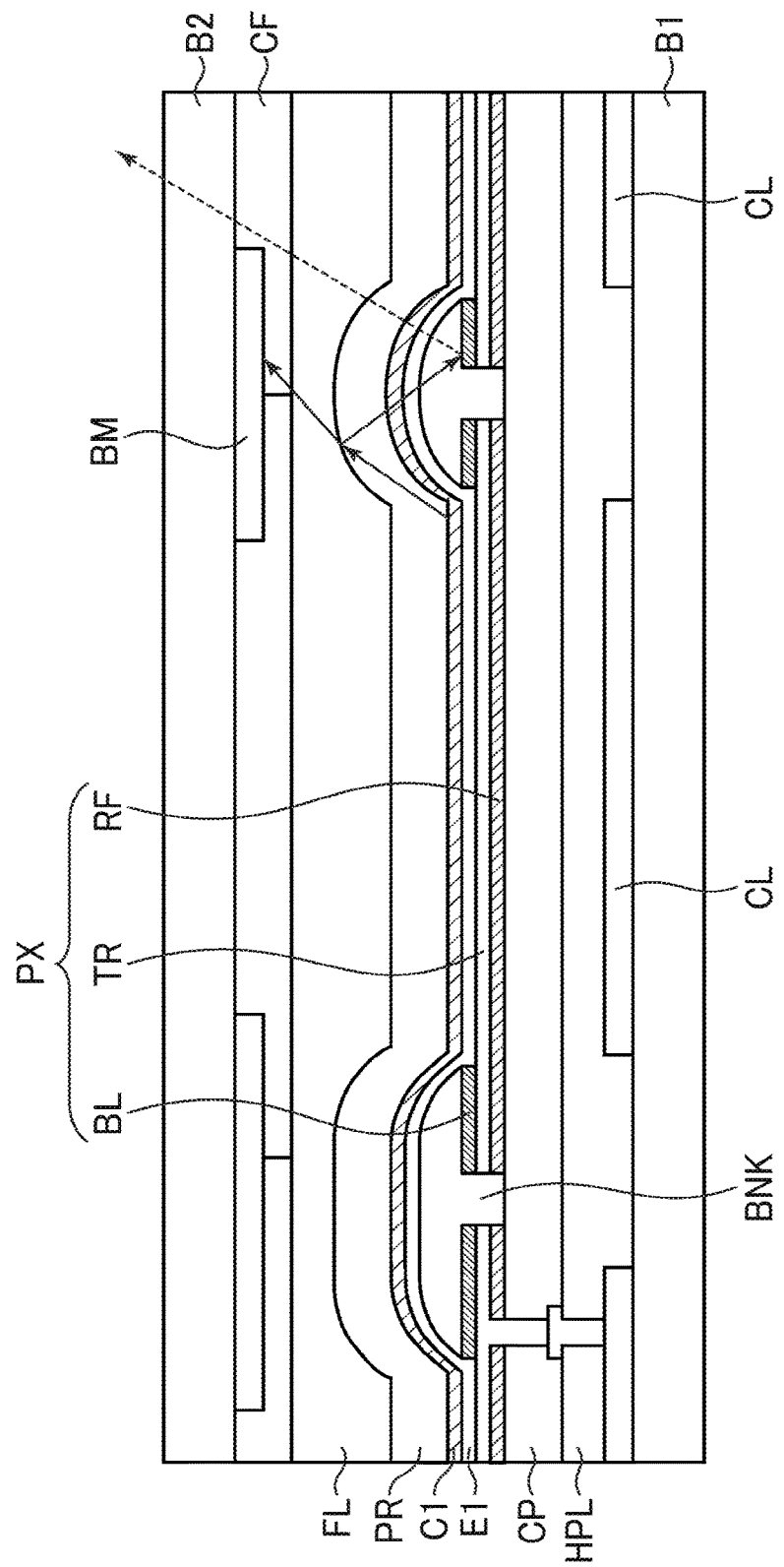
FIG. 8 schematically illustrates a cross section of the pixel of the light emitting display device according to a variation of the second embodiment.

Further, FIG. 8 illustrates a sectional view illustrating the schematic structure of the pixel of the light emitting display device 1 according to a variation of the second embodiment. As illustrated in FIG. 8, the pixel electrode PX of the light emitting display device 1 according to the variation is configured to include the transparent conductive layer TR formed with a transparent metal such as ITO, besides the reflecting electrode RF and the alight absorbing electrode layer BL. Specifically, the pixel electrode PX according to the variation is configured that the transparent conductive layer TR is laminated in contact with the upper side of the reflecting electrode RF, and the light absorbing electrode layer BL is laminated on the upper side of the transparent conductive layer TR. A part of the light absorbing electrode layer BL that is not covered by the bank layer BNK is removed by etching as in the case of FIG. 7.

In the case of the variation of FIG. 8, the transparent conductive layer TR is the surface that carries the light emitting layer E1 on the central part of the pixel substrate PX. The work function is improved by the interposition of the transparent conductive layer TR between the reflecting electrode RF and the light emitting layer E1, and the light emission in the light emitting layer E1 is accelerated. The light emitting display device 1 according to the second embodiment and the light emitting display device 1 according to the variation of the second embodiment are substantially the same with the light emitting display device according to the first embodiment except for the above mentioned points, and the explanation on the points that are substantially the same are skipped.

Third Embodiment

Next, the light emitting display device 1 according to the third embodiment of the present invention is explained.

Figure 9:
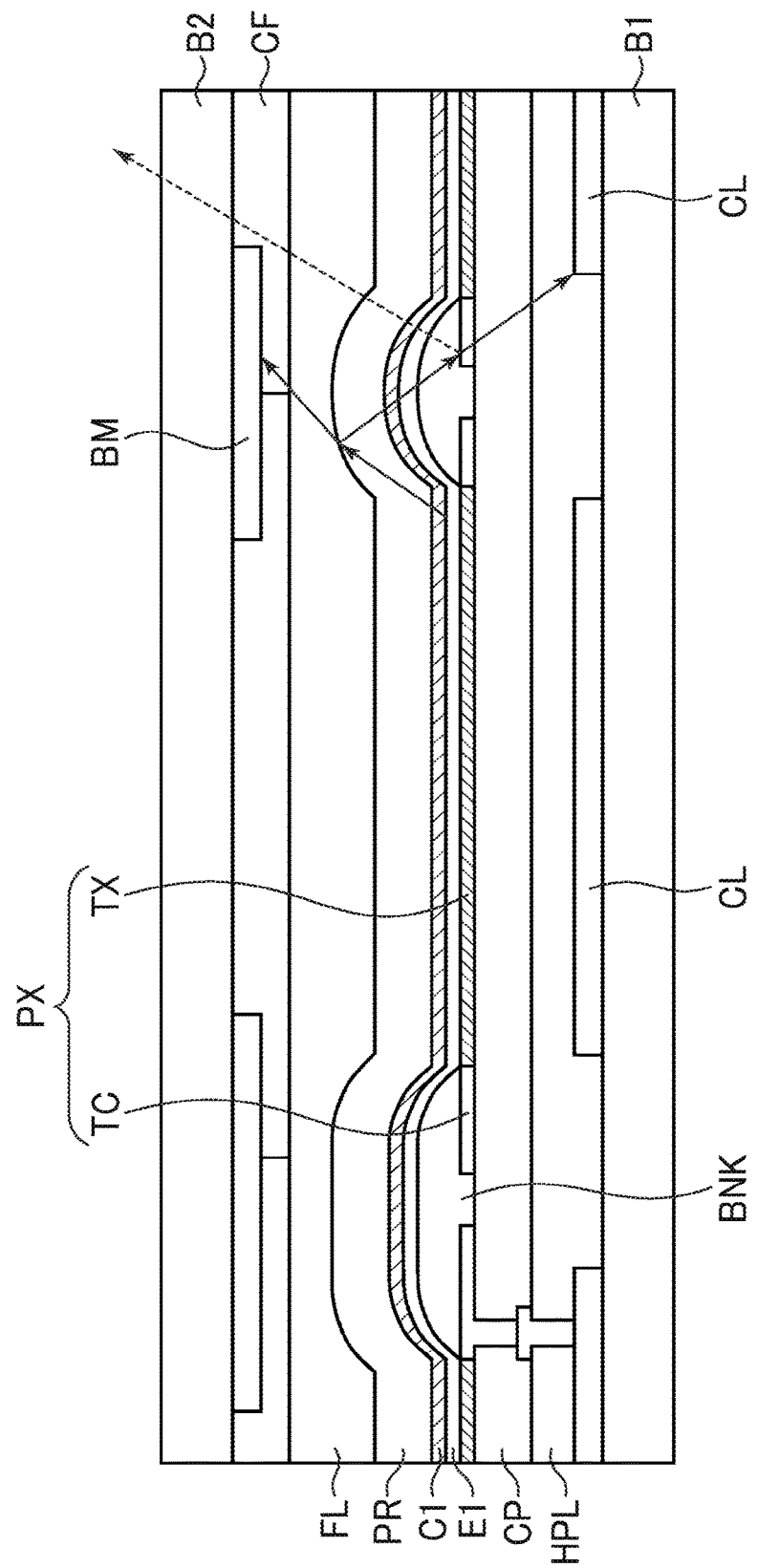
FIG. 9 schematically illustrates a cross section of the pixel of the light emitting display device according to the third embodiment.

FIG. 9 illustrates a sectional view of the schematic structure of the pixel of the light emitting display device 1 according to the third embodiment, and corresponds to IV-IV cross section of FIG. 3. As illustrated in FIG. 9, the pixel electrode PX of the light emitting display device 1 according to the third embodiment is configured to include a transparent compound layer TC and a metal layer TX.

The transparent compound layer TC is formed with a compound that is light transmitting and can be reduced to a metal, and for example, is formed with a metal oxide semiconductor. Further, the metal layer TX is formed through a process that the transparent conductive layer TC is exposed to an atmosphere of the reducing fluid and heated, and, as in the case of the first embodiment, is formed in a self-alignment manner by a reduction reaction at a region that is not covered by the bank layer BNK.

As the transparent compound layer TC that a compound being light transmitting, specifically, tin oxide ($SnO_2$), ITO (indium tin oxide), IZO (indium zinc oxide) and the like may be used, for example. By reducing the transparent compound layer TC to a metal, the central part of the pixel substrate PX is formed to be light reflecting and conductive.

As in the case of the light emitting display device 1 according to the third embodiment, by modifying the surface of the pixel substrate PX at the central part not covered by the bank layer BNK to be the metal layer TX made of the metal reduced from the transparent compound layer TC, and moreover making the surface of the pixel electrode PX at the peripheral part overlapped with the bank layer BNK with the transparent compound layer TC that is light transmitting, the reflection of light at the peripheral part from the light emitting layer E1 is reduced and the light leakage to the neighboring pixels or the like is suppressed.

The light emitting display device 1 according to the third embodiment is substantially the same with the light emitting display device 1 according to the first embodiment except for the above mentioned points, and the explanation on the points that are substantially the same are skipped.

Fourth Embodiment

Next, the light emitting display device 1 according to the fourth embodiment of the present invention is explained.

Figure 10:
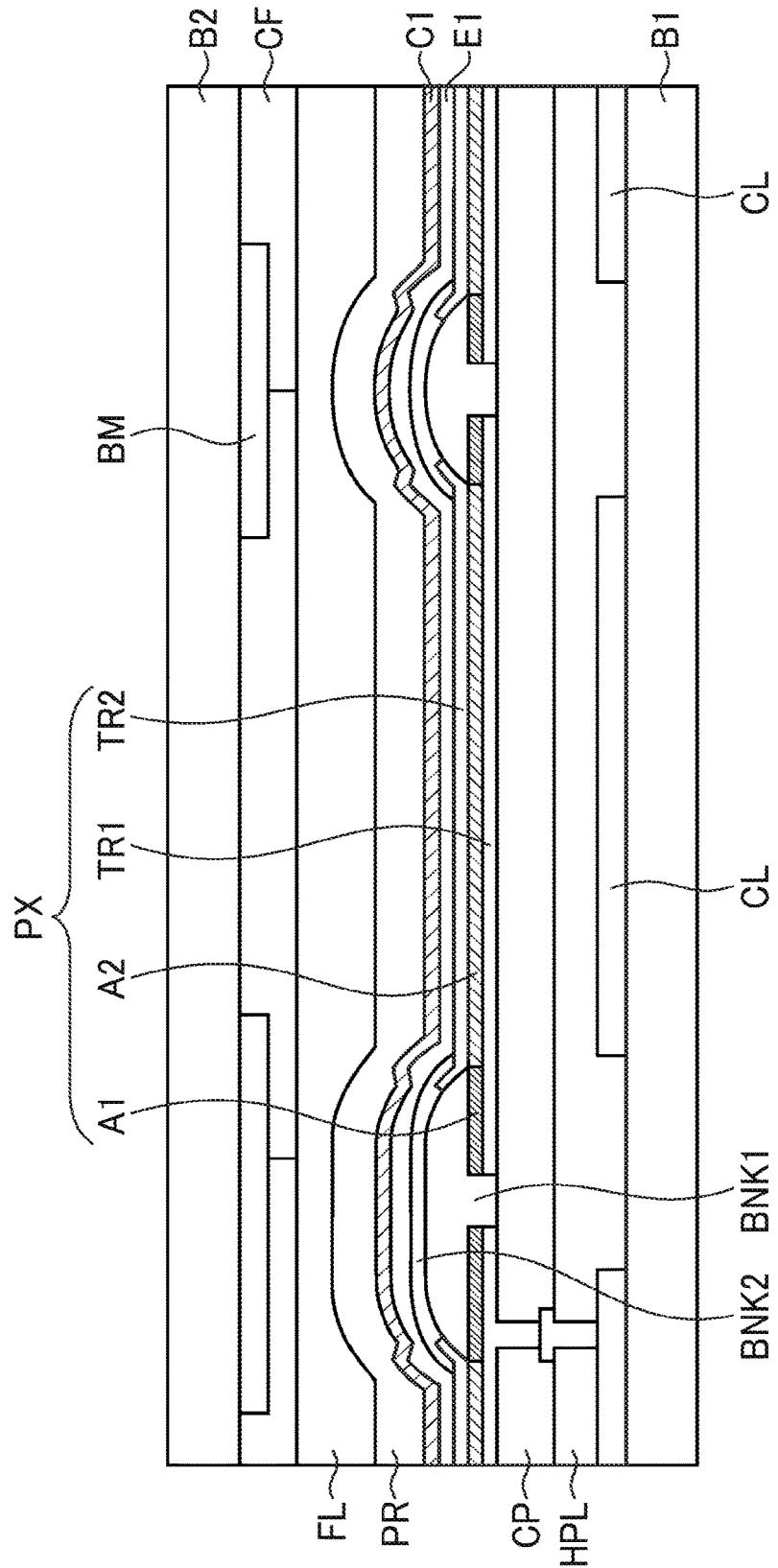
FIG. 10 schematically illustrates a cross section of the pixel of the light emitting display device according to the fourth embodiment.

FIG. 10 illustrates a sectional view of the schematic structure of the pixel of the light emitting display device 1 according to the fourth embodiment, and corresponds to IV-IV cross section of FIG. 3. As illustrated in FIG. 10, the pixel electrode PX of the light emitting display device 1 according to the fourth embodiment is configured to include a first transparent conductive layer TR1, a second transparent conductive layer TR2, the absorbing electrode layer A1 and the reflecting electrode layer A2.

The absorbing electrode layer A1 and the reflecting electrode layer A2 are similar to those according to the first embodiment, and the material of the absorbing electrode layer A1 is reduced through an opening that is not covered by the first bank layer BNK1 to form the reflecting electrode layer A2 in a self-alignment manner. The first transparent conductive layer TR1 and the second transparent conductive layer TR2 are configured to include a transparent metal such as ITO.

The pixel of the light emitting display device 1 according to the fourth embodiment is formed such that after the reflecting electrode layer A2 is formed through the reduction reaction, the second transparent conductive layer TR2 that is independently provided in each pixel is further formed, and the second bank layer BNK2 is formed so as to cover the peripheral part of the second transparent conductive layer TR2. The light emitting layer E1 and the common electrode C1 are formed above the second transparent conductive layer TR2. The second transparent conductive layer TR2 is interposed between the light emitting layer E1 and the reflecting electrode layer A2, and therefore the work function is improved and the light emission in the light emitting layer E1 is accelerated.

The light emitting display device 1 according to the fourth embodiment is substantially the same with the light emitting display device 1 according to the first embodiment except for the above mentioned points, and the explanation on the points that are substantially the same are skipped.

It is to be noted that the light emitting devices according to the above embodiments are not limited to an organic EL display device, and may be a display device that are provided with a light emitting element such as a quantum dot light emitting diode (QLED) for each pixel.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a plurality of pixel electrodes that correspond to each of a plurality of unit pixels composing an image;
an insulation layer that is arranged to be put on a peripheral part of each of the plurality of pixel electrodes and is light transmitting;
a light emitting layer that is laminated in contact with a central part of each of the plurality of pixel electrodes and is arranged to emit light with a luminosity controlled by a current, the central part surrounded by the peripheral part; and
a common electrode that is laminated in contact with the light emitting layer and is arranged to be put on the insulation layer over the plurality of pixel electrodes, wherein
each of the plurality of pixel electrodes has a surface on which the insulation layer and the light emitting layer are put,
the peripheral part is either light absorbing or light transmitting on the surface,
the central part is light reflecting on the surface,
each of the plurality of pixel electrodes has a layer that composes the surface,
the peripheral part is formed with a compound that can be reduced to a metal and is light absorbing in the layer that composes the surface, and
the central part is formed with the metal in the layer.

2. A display device comprising:
a plurality of pixel electrodes that correspond to each of a plurality of unit pixels composing an image;
an insulation layer that is arranged to be put on a peripheral part of each of the plurality of pixel electrodes and is light transmitting;
a light emitting layer that is laminated in contact with a central part of each of the plurality of pixel electrodes and is arranged to emit light with a luminosity controlled by a current, the central part surrounded by the peripheral part; and
a common electrode that is laminated in contact with the light emitting layer and is arranged to be put on the insulation layer over the plurality of pixel electrodes, wherein
each of the plurality of pixel electrodes has a surface on which the insulation layer and the light emitting layer are put,
the peripheral part is either light absorbing or light transmitting on the surface,
the central part is light reflecting on the surface,
each of the plurality of pixel electrodes has a layer that composes the surface,
the peripheral part is formed with a compound that can be reduced to a metal and is light transmitting in the layer that composes the surface, and
the central part is formed with the metal in the layer.

3. A display device comprising:
a plurality of pixel electrodes that correspond to each of a plurality of unit pixels composing an image;
an insulation layer that is arranged to be put on a peripheral part of each of the plurality of pixel electrodes and is light transmitting;
a light emitting layer that is laminated in contact with a central part of each of the plurality of pixel electrodes and is arranged to emit light with a luminosity controlled by a current, the central part surrounded by the peripheral part; and
a common electrode that is laminated in contact with the light emitting layer and is arranged to be put on the insulation layer over the plurality of pixel electrodes, wherein
each of the plurality of pixel electrodes has a surface on which the insulation layer and the light emitting layer are put,
the peripheral part is either light absorbing or light transmitting on the surface,
the central part is light reflecting on the surface,
each of the plurality of pixel electrodes has a first layer that is light reflecting and a second layer that is laminated on the first layer and is light absorbing,
the surface is composed of the first layer in the central part, and
the surface is composed of the second layer in the peripheral part.

* * * * *